US012660534B2

(12) United States Patent
Kato et al.

(10) Patent No.: US 12,660,534 B2
(45) Date of Patent: Jun. 16, 2026

(54) METHOD FOR MANUFACTURING SEMICONDUCTOR DEVICE

(71) Applicants: DENSO CORPORATION, Kariya-city (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP)

(72) Inventors: Kozo Kato, Nisshin (JP); Daisuke Kawaguchi, Hamamatsu (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP)

( * ) Notice: Subject to any disclaimer, the term of this patent is extended or adjusted under 35 U.S.C. 154(b) by 770 days.

(21) Appl. No.: 17/947,585

(22) Filed: Sep. 19, 2022

(65) Prior Publication Data

US 2023/0095477 A1 Mar. 30, 2023

(30) Foreign Application Priority Data

Sep. 27, 2021 (JP) ................................. 2021-157201

(51) Int. Cl.
*H10P 34/42* (2026.01)
*H10D 62/13* (2025.01)
(Continued)

(52) U.S. Cl.
CPC ........... *H10P 34/42* (2026.01); *H10D 62/156* (2025.01); *H10P 58/00* (2026.01); *H10P 95/11* (2026.01);
(Continued)

(58) Field of Classification Search
CPC .............. H01L 21/428; H01L 21/7806; H01L 21/268–2686
See application file for complete search history.

(56) References Cited

U.S. PATENT DOCUMENTS 4,959,700 A * 9/1990 Yamazaki ......... H01L 21/02667
257/E21.101
2002/0086502 A1* 7/2002 Liu ................... H01L 21/26513
257/E21.336

(Continued)

FOREIGN PATENT DOCUMENTS

JP 2001-189460 A 7/2001
JP 2017-092127 A 5/2017
JP 2020-102520 A 7/2020

*Primary Examiner* — Christine S. Kim
*Assistant Examiner* — Andrew Victor Prostor
(74) *Attorney, Agent, or Firm* — Posz Law Group, PLC

(57) ABSTRACT

A method for manufacturing a semiconductor device, includes: applying a laser beam to a plane extending at a predetermined depth in a semiconductor substrate from a second main surface side of the semiconductor substrate opposite to a first main surface side on which a device structure including a channel is formed; and peeling off a device layer including the device structure from the semiconductor substrate along the plane applied with the laser beam. In the applying of the laser beam, the laser beam is applied so that a power density is lower in a region corresponding to the channel in a thickness direction of the semiconductor substrate than in the other region, in the plane extending at the predetermined depth in the semiconductor substrate.

12 Claims, 20 Drawing Sheets

(51) Int. Cl.

| | | |
|---|---|---|
| *H10P 58/00* | (2026.01) | |
| *H10P 95/00* | (2026.01) | |
| *H10D 62/80* | (2025.01) | |
| *H10D 62/832* | (2025.01) | |
| *H10D 62/85* | (2025.01) | |

(52) U.S. Cl.
CPC ......... *H10D 62/80* (2025.01); *H10D 62/8325* (2025.01); *H10D 62/8503* (2025.01)

(56) References Cited

U.S. PATENT DOCUMENTS

| | | | |
|---|---|---|---|
| 2013/0089969 A1* | 4/2013 | Wagner | H01L 21/30617 |
| | | | 438/463 |
| 2017/0316998 A1* | 11/2017 | Marutani | H01L 21/561 |
| 2019/0099838 A1 | 4/2019 | Rieske et al. | |
| 2019/0363291 A1* | 11/2019 | Sakamoto | H10K 50/115 |
| 2020/0066542 A1 | 2/2020 | Drescher et al. | |
| 2020/0215648 A1 | 7/2020 | Swoboda et al. | |
| 2020/0388538 A1 | 12/2020 | Swoboda et al. | |
| 2021/0197314 A1 | 7/2021 | Swoboda et al. | |
| 2021/0225659 A1 | 7/2021 | Drescher et al. | |
| 2021/0225709 A1 | 7/2021 | Rieske et al. | |

\* cited by examiner

○  FIRST APPLICATION POSITION COORDINATES
●  SECOND APPLICATION POSITION COORDINATES

METHOD FOR MANUFACTURING SEMICONDUCTOR DEVICE

CROSS REFERENCE TO RELATED APPLICATION

The present application claims the benefit of priority from Japanese Patent Application No. 2021-157201 filed on Sep. 27, 2021. The entire disclosures of the above application are incorporated herein by reference.

TECHNICAL FIELD

The present disclosure relates to a method for manufacturing a semiconductor device.

BACKGROUND

It has been developed a technique of forming a device structure on one main surface of a semiconductor substrate and then peeling off a device layer having the device structure formed therein from the semiconductor substrate. By using such a technique, it is possible to reuse the semiconductor substrate from which the device layer has been peeled off. Further, it is possible to reduce the manufacturing costs of semiconductor devices. For example, it has been known a technique of forming an altered layer inside of a semiconductor substrate by irradiating a plane extending at a predetermined depth inside of the semiconductor substrate with a laser beam, and peeling off the device layer along the plane where the altered layer has been formed from the semiconductor substrate.

SUMMARY

The present disclosure describes a method for manufacturing a semiconductor device including: applying of a laser beam to a plane extending at a predetermined depth in a semiconductor substrate; and peeling off a device layer in which a device structure is formed from the semiconductor substrate along the plane applied with the laser beam.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1:
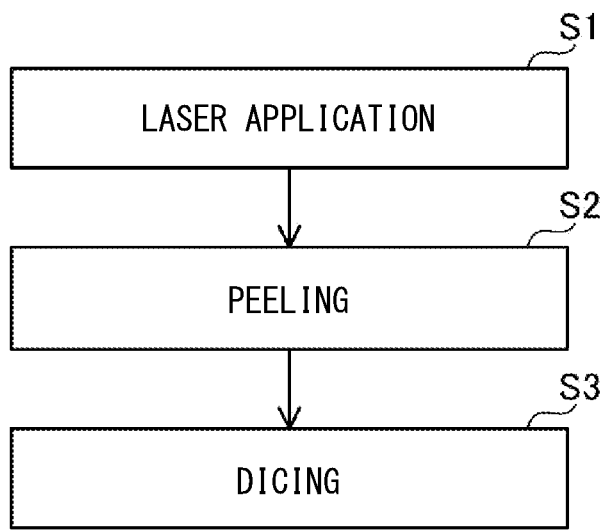
FIG. 1 is a diagram showing a flow of a manufacturing process of a semiconductor device, including a laser application process, a peeling process, and a dicing process.

To begin with, a relevant technology will be described only for understanding the embodiments of the present disclosure.

For example, it has been known a technique of forming an altered layer inside of a semiconductor substrate by irradiating a plane extending at a predetermined depth inside of the semiconductor substrate with a laser beam, and peeling off the device layer along the plane where the altered layer has been formed from the semiconductor substrate.

According to studies by the inventors of the present disclosure, it has been found that a part of the laser beam that is not absorbed at a focal point reaches the device structure and causes a change in electrical characteristics of the device structure. In particular, it has been found that the laser beam reaching the device structure causes variations in leakage current and a shift of threshold voltage. Thus, a method for manufacturing a semiconductor device that suppresses variations in electrical characteristics of such device structures is necessary.

In an aspect of the present disclosure, a method for manufacturing a semiconductor device includes: applying a laser beam to a plane extending at a predetermined depth in a semiconductor substrate from a second surface side of the semiconductor substrate opposite to a first surface side on which a device structure having a channel is formed; and peeling off a device layer in which the device structure is formed from the semiconductor substrate along the plane. In the applying of the laser beam, the laser beam is applied so that a power density of the laser beam is lower in a region corresponding to the channel of the device structure in a thickness direction of the semiconductor substrate than in the other region, in the plane extending at the predetermined depth.

In this case, "the plane extending at the predetermined depth of the semiconductor substrate" refers to a plane extending in a direction orthogonal to the thickness direction of the semiconductor substrate, and having a predetermined thickness in consideration of the spread of the focal points of the laser beams. "The region corresponding to the channel of the device structure in the thickness direction of the semiconductor substrate" or "the region corresponding to the lower side of the channel of the device structure" refers to a region including at least a part of a region overlapping the channel of the device structure when the semiconductor substrate is viewed in the thickness direction, that is, in the thickness direction of the semiconductor substrate. "The power density of the laser beam" refers to the light intensity of the laser beam per unit area on the plane extending at the predetermined depth in the semiconductor substrate, when the semiconductor substrate is viewed in the thickness direction. In such a method, the power density of the laser beam is lower at least in the region corresponding to the channel of the device structure than the other region, and may include a case where the power density of the laser beam in the region corresponding to the channel of the device structure is substantially zero.

According to such a method, the power density of the laser beam applied to the region corresponding to the channel of the device structure is low. For this reason, the light intensity of the laser beam that has not been absorbed at the focal point is lowered in the region corresponding to the channel of the device structure. Therefore, it is possible to suppress a part of the laser beam that has not been absorbed at the focal point from reaching the channel of the device structure. As a result, variations in the electrical characteristics of the device structure can be suppressed Namely, a method for manufacturing a semiconductor device disclosed in this specification may include a laser application process and a peeling process. In the laser application process, a laser beam is applied to a plane in a semiconductor substrate extending at a predetermined depth in the semiconductor substrate. The semiconductor substrate is not particularly limited, but may be a compound semiconductor substrate. For example, the semiconductor substrate may be made of a nitride semiconductor including gallium nitride, a silicon carbide, or a gallium oxide. By the method for manufacturing a semiconductor device disclosed in this specification, the semiconductor substrate can be reused. Thus, the method for manufacturing a semiconductor device disclosed in this specification may be useful when applied to a semiconductor substrate of an expensive compound semiconductor.

The semiconductor substrate has a first main surface and a second main surface opposite to the first main surface, and a device structure having a channel is formed on a side adjacent to the first main surface. The type of the device structure is not particularly limited, but may be, for example, a switching element structure. As the type of the switching element structure, for example, the switching element may be a metal oxide semiconductor field effect transistor (MOSFET) or an insulated gate bipolar transistor (IGBT).

In the laser application process, a laser beam is applied to a predetermined depth of the semiconductor substrate from the second main surface side on which the device structure is not formed. In the peeling process, a device layer in which the device structure is formed is peeled off from the semiconductor substrate along the plane irradiated with the laser beam. In the laser application process, the laser beam is applied so that a power density of the laser beam is lower in a region corresponding the channel in a thickness direction of the semiconductor substrate than in the other region, in the plane extending at the predetermined depth in the semiconductor substrate.

In an aspect of the manufacturing method described above, the laser application process may include steps of: preparing a laser application coordinate data including a plurality of application position coordinates specifying positions to apply the laser beam to the semiconductor substrate in a two-dimensional coordinate system defining in-plane positions in the semiconductor substrate, that is, positions in a plane of the semiconductor substrate; preparing a channel coordinate data including one or more channel position coordinates specifying a position of the channel of the device structure in the two-dimensional coordinate system; categorizing the plurality of application position coordinates into one or more first application position coordinates that are not included in the one or more channel position coordinates and one or more second application coordinates that are included in the one or more channel position coordinates; and applying the laser beam to the predetermined depth in the semiconductor substrate at one or more positions corresponding to the one or more first application position coordinates while refraining application of the laser beam to the predetermined depth at one or more positions corresponding to the one or more second application position coordinates.

In such a method, by controlling the application of the laser beam based on the first application position coordinates and the second application position coordinates, the power density of the laser beam can be lowered in the region corresponding to the channel of the device structure in the thickness direction of the semiconductor substrate than in the other region, in the plane extending at the predetermined depth in the semiconductor substrate.

In an aspect of the manufacturing method described above, the laser application process may include steps of: arranging a laser shielding film for shielding the laser beam in a region corresponding to the channel of the device structure in the thickness direction of the semiconductor substrate; and applying the laser beam to the predetermined depth in the semiconductor substrate over the laser shielding film. In this case, the "arranging of the laser shielding film" means that the laser shielding film is present at least in the region corresponding to the channel in the thickness direction of the semiconductor substrate. Although not particularly limited, examples of the arranging of the laser shielding film may include an arrangement in which the laser shielding film is film-formed on the second main surface of the semiconductor substrate or in an inside of the semiconductor substrate, an arrangement in which the laser shielding film is placed on the second main surface of the semiconductor substrate, and an arrangement in which the laser shielding film is placed apart from the second main surface of the semiconductor substrate.

In such a method, since the laser shielding film blocks the laser beam, the power density of the laser beam can be lowered in the region corresponding to the channel in the thickness direction of the semiconductor substrate than in the other region, in the plane extending at the predetermined depth in the semiconductor substrate.

The arranging of the laser shielding film may include steps of: film-forming the laser shielding film entirely over the second main surface of the semiconductor substrate; and partly removing the laser shielding film so that the laser shielding frim is left in the region corresponding to the channel of the device structure in the thickness direction of the semiconductor substrate. By such a method, the laser shielding film can be formed on the second main surface of the semiconductor substrate.

The arranging of the laser shielding film may include steps of: film-forming the laser shielding film over the entirety of a surface of a base substrate; partly removing the laser shielding film so that the laser shielding film is left in a region corresponding to a formation position where the channel of the device structure is to be formed; and film-forming an epitaxial layer on the surface of the base substrate thereby to form the semiconductor substrate. The "region corresponding to the formation position where the channel of the device structure is to be formed" means the region corresponding to the channel of the device structure in the thickness direction of the semiconductor substrate when the device structure is formed on the semiconductor substrate. By such a method, the laser shielding film can be formed inside of the semiconductor substrate.

In an aspect of the manufacturing method described above, the applying of the laser beam may include steps of: film-forming a mask over the entirety of the second main surface of the semiconductor substrate; partly removing the mask so that a region corresponding to the channel in the thickness direction of the semiconductor substrate is opened; and forming a damage region by applying damage to the second main surface of the semiconductor substrate exposed from the mask; removing the mask after the forming of the damage region; and applying the laser beam to the predetermined depth of the semiconductor substrate over the damage region. The surface roughness of the second main surface of the semiconductor substrate is increased in the damage region. Therefore, the amount of transmission of the laser beam through the damage region is greatly reduced by reflection and/or scattering. By such a method, since the damage region blocks the laser beam, the power density of the laser beam can be lowered in the region corresponding to the channel in the thickness direction of the semiconductor substrate than in the other region, in the plane extending at the predetermined depth in the semiconductor substrate.

Hereinafter, embodiments of the present disclosure will be described in detail with reference to the drawings.

Firstly, a laser application process, a peeling process, and a dicing process of a manufacturing method of a semiconductor device will be described with reference to the drawings. Thereafter, some examples of the laser application process of the present disclosure will be described in detail. Note that, in the manufacturing method of the semiconductor device, known techniques can be utilized for processes other than the laser application process, the peeling process, and the dicing process. For example, a device structure can be produced by utilizing a known technique.

FIG. 1 shows a flow of a manufacturing process including a laser application process (S1), a peeling process (S2) and a dicing process (S3). In a method for manufacturing a semiconductor device disclosed in this specification, a plurality of semiconductor devices, which are also called chips, are produced by carrying out these processes to a semiconductor substrate 1 shown in FIG. 2.

Figure 2:
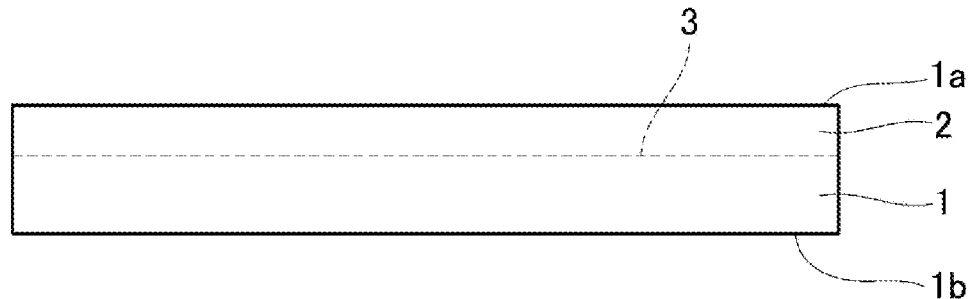
FIG. 2 is a diagram schematically showing a cross-sectional view of a semiconductor substrate in the manufacturing process of the semiconductor device.

As shown in FIG. 2, the semiconductor substrate 1 has an upper surface 1a and a lower surface 1b, which are planar and extend parallel to each other. These upper surface 1a and lower surface 1b are also referred to as main surfaces. The upper surface 1a and the lower surface 1b will also be referred to as a first main surface and a second main surface. Although the semiconductor substrate 1 is not particularly limited, the semiconductor substrate 1 is a gallium nitride substrate in this example. A plane 3 extending at a predetermined depth in the semiconductor substrate 1 is a plane irradiated with a laser beam, that is, a surface on which a plurality of laser focal points are concentrated. In this specification, a part of the semiconductor substrate 1 above the laser irradiation plane 3, that is, a part to be peeled off from the semiconductor substrate 1 is referred to as a device layer 2. The device layer 2 of the semiconductor substrate 1 is formed with a device structure having a channel.

Figure 3:
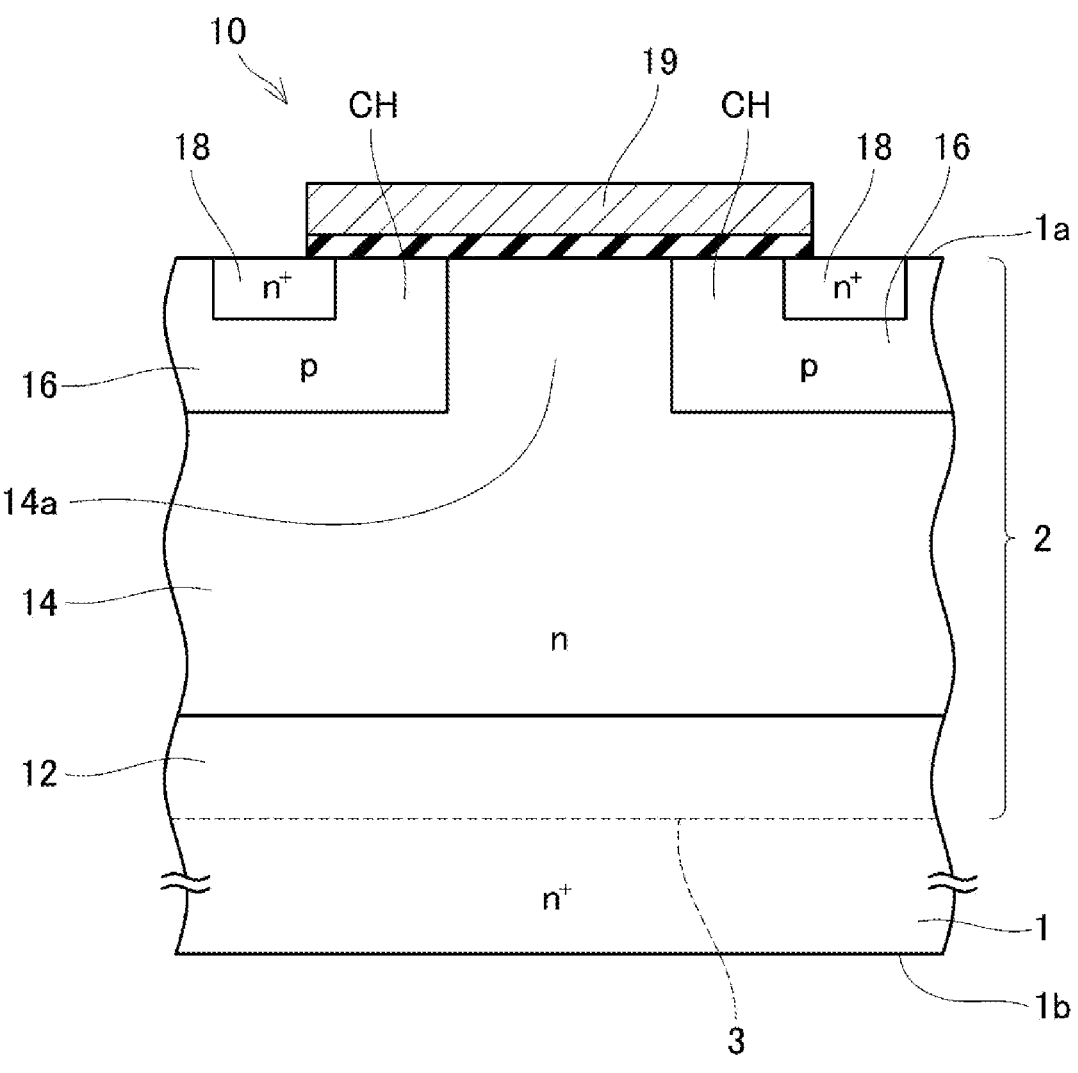
FIG. 3 is a diagram schematically showing a cross-sectional view of a unit cell of a device structure formed adjacent to an upper surface of the semiconductor substrate.

FIG. 3 shows a unit cell of a device structure 10 formed within the device layer 2 of the semiconductor substrate 1. Although not particularly limited, the device structure 10 is a vertical MOSFET, for example. The device structure 10 has an $n^+$ type drain region 12, an n type drift region 14, a p type body region 16, an $n^+$ type source region 18, and a planar insulated gate 19. The drain region 12 is provided at a position exposed on the lower surface 1b of the semiconductor substrate 1. The drift region 14 is provided between the drain region 12 and the body region 16. A part of the drift region 14 that is exposed on the upper surface 1a of the semiconductor substrate 1 is called a JFET region 14a. The body region 16 is provided at a position exposed on the upper surface 1a of the semiconductor substrate 1 and is arranged to separate the drift region 14 and the source region 18 from each other. A part of the body region 16 located between the JFET region 14a of the drift region 14 and the source region 18 is referred to as a channel CH. The source region 18 is provided at a position exposed on the upper surface 1a of the semiconductor substrate 1. The insulated gate 19 is provided to cover a portion of the upper surface 1a of the semiconductor substrate 1 and is arranged to face the channel CH of the body region 16. As such, the electron density in an inversion layer generated in the channel CH of the body region 16 is controlled according to the voltage applied to the insulated gate 19, so that on and off of the device structure 10 is controlled. Thus, the channel CH is defined as a region in which the carrier density is controlled by the gate.

Figure 4:
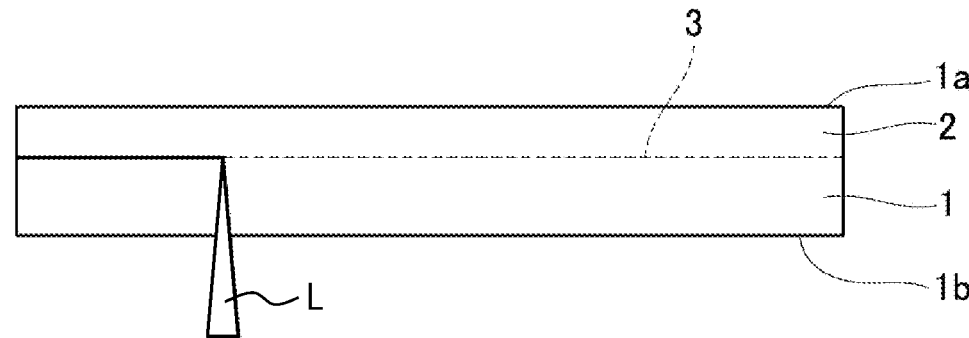
FIG. 4 is a diagram schematically showing a cross-sectional view of the semiconductor substrate in the manufacturing process of the semiconductor device.

In the laser application process (S1 in FIG. 1), a laser beam L is applied to the plane 3 that extends at the predetermined depth in the semiconductor substrate 1, as shown in FIG. 4. The laser beam L is applied from the lower surface 1 b side of the semiconductor substrate 1 on which the device structure 10 is not formed. The laser beam L is applied so as to be focused at the predetermined depth in the semiconductor substrate 1. The laser beam L has a wavelength range that is transmissive to the semiconductor substrate 1, e.g., the gallium nitride substrate in this example. At the position of the focal point, the crystal forming the semiconductor substrate 1, such as a single crystal of gallium nitride in this example, is heated and decomposed. As a result, an extraction layer of atoms forming the crystal of the semiconductor substrate 1 is formed at the positions of the focal points, as an altered layer. In this example, the extraction layer is made of gallium. The strength of the altered layer is lower than that of the crystal forming the semiconductor substrate 1. Therefore, the strength of the altered layer is lower than that of the surrounding crystal.

In the laser application process, the laser beam L is applied so that the power density of the laser beam L is lower in a region corresponding to the channel CH of the device structure 10 in a thickness direction of the semiconductor substrate than in the other region, in the plane 3 extending at the predetermined depth in the semiconductor substrate 1. In other words, the laser beam L is applied so that the power density of the laser beam L is lower in a region corresponding to a lower side of the channel CH than in the other region in the plane 3. Specifically, the laser beam L is applied so that the power density of the laser beam L is lower in a region that corresponds to at least a part of the channel CH of the device structure 10 in a plan view, that is, in a direction orthogonal to the surface of the semiconductor substrate 1 than in the other region. For example, the laser beam L is applied so that the power density of the laser beam L is lower in a region that encompasses the entire region corresponding to the channel CH of the device structure 10 in the thickness direction of the semiconductor substrate 1 than in the other region. Various examples for forming such a power density distribution in the laser application process will be described later. Due to such a power density distribution, the intensity of the laser beam L that is not absorbed at the focal point is lowered in the region below the channel CH of the device structure 10. Therefore, it is possible to suppress a part of the unabsorbed laser beam from reaching the channel CH of the device structure 10. As a result, variations in the electrical characteristics of the device structure 10 can be suppressed.

Figure 5:
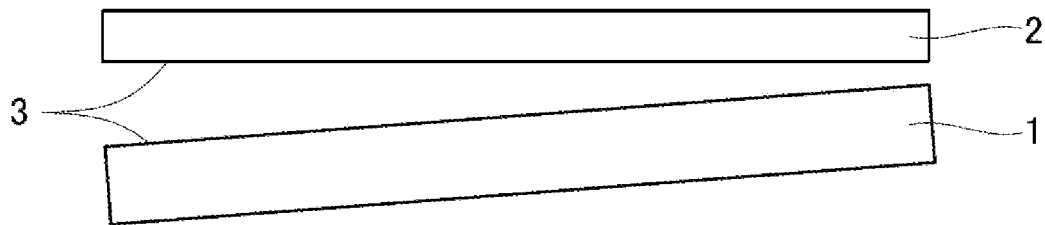
FIG. 5 is a diagram schematically showing a cross-sectional view of the semiconductor substrate in the manufacturing process of the semiconductor device.

In the peeling process (S2 in FIG. 1), the device layer 2 in which the device structure 10 has been formed is peeled off from the semiconductor substrate 1 along the plane 3 irradiated with the laser beam L, as shown in FIG. 5. Since the strength of the semiconductor substrate 1 is lowered at the laser irradiated plane 3 due to the formation of the altered layer, the device layer 2 can be peeled off from the semiconductor substrate 1 satisfactorily. The semiconductor substrate 1, from which the device layer 2 has been removed, is reused for further manufacturing semiconductor devices. For example, after polishing and etching a peeled surface of the semiconductor substrate 1 from which the device layer 2 has been removed, a device layer is film-formed on the peeled surface using an epitaxial crystal growth technique, and a device structure is formed in the device layer film-formed.

Figure 6:
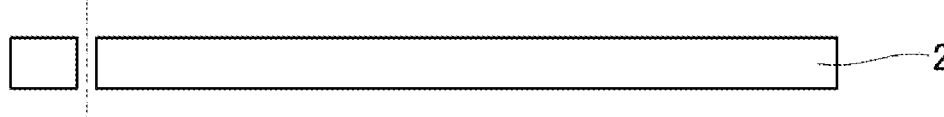
FIG. 6 is a diagram schematically showing a cross-sectional view of the semiconductor substrate in the manufacturing process of the semiconductor device.

In the dicing process (S3 in FIG. 1), the device layer 2, which has been peeled off from the semiconductor substrate 1, is subjected to a polishing process, an electrode forming process, and the like. Then, the device layer 2 is cut out into devices (dices), as shown in FIG. 6. In this way, the semiconductor device is produced.

Hereinafter, specific examples of the laser application process will be described.

<First Example of Laser Application Process>

A first example of the laser application process will be described with reference to FIGS. 7 to 10. In the first example of the laser application process, a laser application coordinate data is firstly prepared (S11 in FIG. 7). The laser application coordinate data includes a plurality of application position coordinates 22, as shown in FIG. 8. The application position coordinates 22 are coordinates for specifying the positions to apply the laser beam L in the semiconductor substrate 1, in a two-dimensional coordinate system that defines in-plane positions of the semiconductor substrate 1. One pulse of the laser beam L is applied to one application position coordinate 22. Although not particularly limited, the application position coordinates 22 are set in a matrix form in which the application position coordinates 22 are arranged at equal intervals in the vertical direction and in the horizontal direction in this example.

Figure 7:
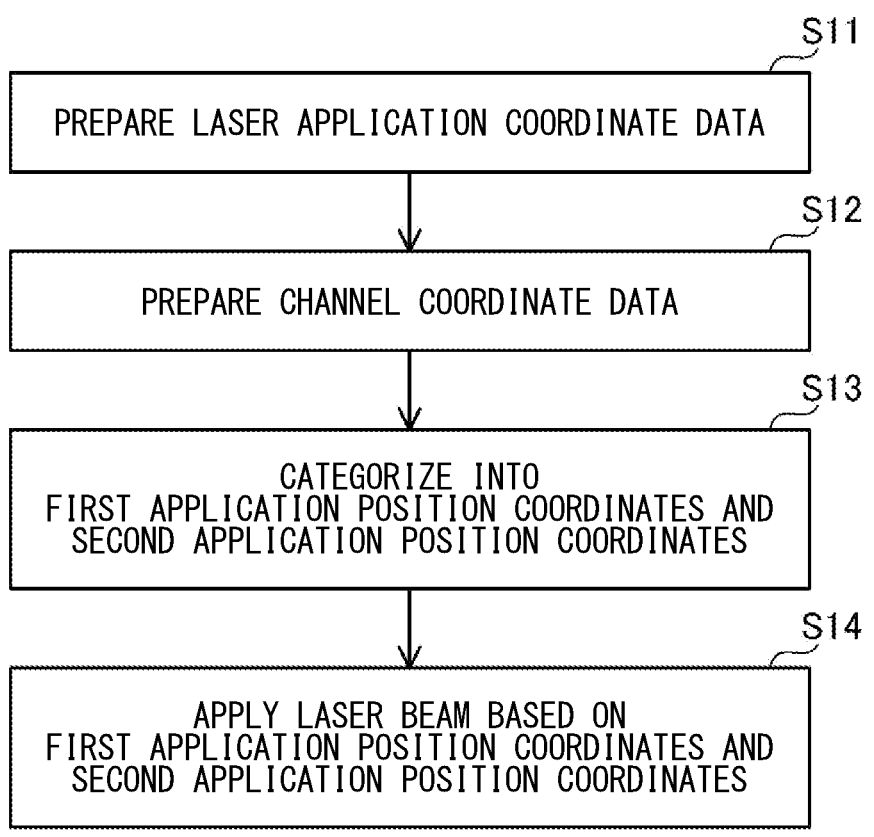
FIG. 7 is a diagram showing a flow of a first example of the laser application process.
Figure 8:
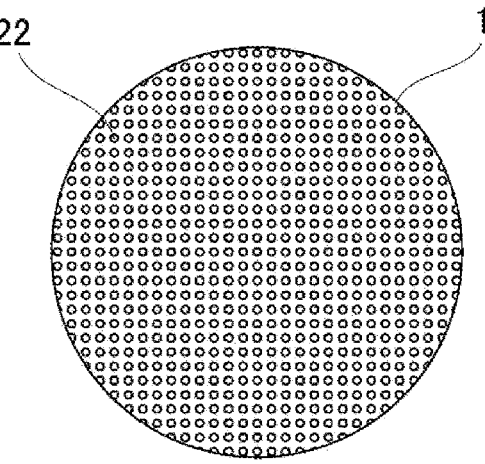
FIG. 8 is a plan view of a semiconductor substrate for showing a plurality of application position coordinates set in the first example of the laser application process.
Figure 9:
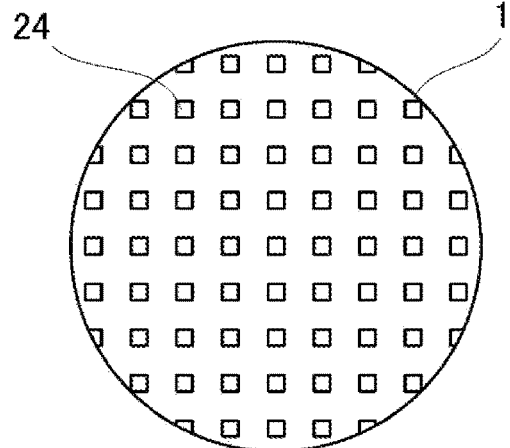
FIG. 9 is a plan view of a semiconductor substrate for showing a plurality of channel position coordinates set in the first example of the laser application process.

Next, as shown in FIG. 9, channel coordinate data including one or more channel position coordinates 24 in the two-dimensional coordinate system is prepared (S12 in FIG. 7). The one or the plurality of channel position coordinates 24 are coordinates for specifying the position of the channel (see channel CH in FIG. 3) of the device structures 10 formed adjacent to the upper surface 1a of semiconductor substrate 1. In this example, the plurality of channel position coordinates 24 are set in a matrix form in which the channel position coordinates 24 are arranged at equal intervals in the vertical direction and in the horizontal direction. Since the channel CH of the device structure 10 has a range, each of the channel position coordinates 24 is set so that the range of the channel CH can be specified. The channel position coordinates 24 may be set by using mask data for photolithography to form the device structures 10. Alternatively, the channel position coordinates 24 may be set based on the positions of the channels CH specified in an image of the upper surface 1a of the semiconductor substrate 1 that is acquired after the device structures 10 are formed on the upper surface 1a of the semiconductor substrate 1.

Figure 10:
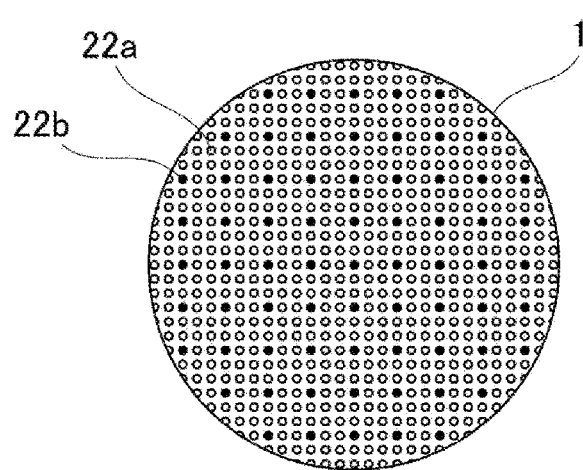
FIG. 10 is a plan view of a semiconductor substrate for showing respective positions of first application position coordinates and second application position coordinates categorized from the plurality of application position coordinates in the first example of the laser application process.

Next, as shown in FIG. 10, the plurality of application position coordinates 22 included in the laser application coordinate data are categorized into a plurality of first application position coordinates 22a and a plurality of second application position coordinates 22b (S13 in FIG. 7). Among the application position coordinates 22, the first application position coordinates 22a are coordinates that are not included in any of the channel position coordinates 24. Among the application position coordinates 22, the second application position coordinates 22b are coordinates included in any of the channel position coordinates 24.

In the first example of the laser application process, the laser beam L is applied to the inside of the semiconductor substrate 1 based on the first application position coordinates 22*a* and second application position coordinates 22*b* made as described above (S14 in FIG. 7). Specifically, the laser beam L is applied to the portion at the predetermined depth inside the semiconductor substrate 1, which corresponds to the first application position coordinate 22*a*, but the laser beam L is not applied to the portion at the predetermined depth inside the semiconductor substrate, which correspond to the second application position coordinate 22*b*. As such, the laser beam L is applied so that the power density of the laser beam L is lower in the region corresponding to the lower side of the channel CH of the device structure 10 than in the other region, in the plane 3 extending at the predetermined depth in the semiconductor substrate 1. As a result, it is possible to suppress a part of the laser beam L that has not been absorbed at the focal point at the predetermined depth of the semiconductor substrate 1 from reaching the channel CH of the device structure 10.

Alternatively, the laser beam L may be applied with a smaller application energy to the portion corresponding to the second application position coordinate 22*b* at the predetermined depth in the semiconductor substrate 1 than that to the portion corresponding to the first application position coordinate 22*a* at the predetermined depth of the semiconductor substrate 1. Also in this case, the laser beam L can be applied so that the power density is lower in the region corresponding to the lower side of the channel CH of the device structure 10 than in the other region. Therefore, it is possible to suppress a part of the laser beam L that has not been absorbed at the focal point from reaching the channel CH of the device structure 10. In this example, the device layer 2 can be satisfactorily peeled off from the semiconductor substrate 1 in the peeling process. The control of the application energy of the laser beam L is not particularly limited, but may be implemented by control of a spatial light modulator (SLM) of a reflective liquid crystal such as liquid crystal on silicon (LCOS) or an attenuator.

<Second Example of Laser Application Process>

A second example of the laser application process will be described with reference to FIGS. 11 to 14. In cross-sectional views of FIGS. 12 to 14, the unit cells of the device structures 10 formed adjacent to the upper surface 1*a* of the semiconductor substrate 1 are shown in a simplified manner. In the second example of the laser application process (S21 in FIG. 11), a laser shielding film 32 is firstly formed on the entirety of the lower surface 1 b of the semiconductor substrate 1, as shown in FIG. 12. The laser shielding film 32 is a film that reflects the laser beam L or a film that is opaque to the laser beam L. The laser shielding film 32 is not particularly limited, but may be, for example, an Al film or an Au film having a thickness of about 1 μm. Alternatively, the laser shielding film 32 may be a black matrix used in a color filter of a liquid crystal panel.

Figure 11:
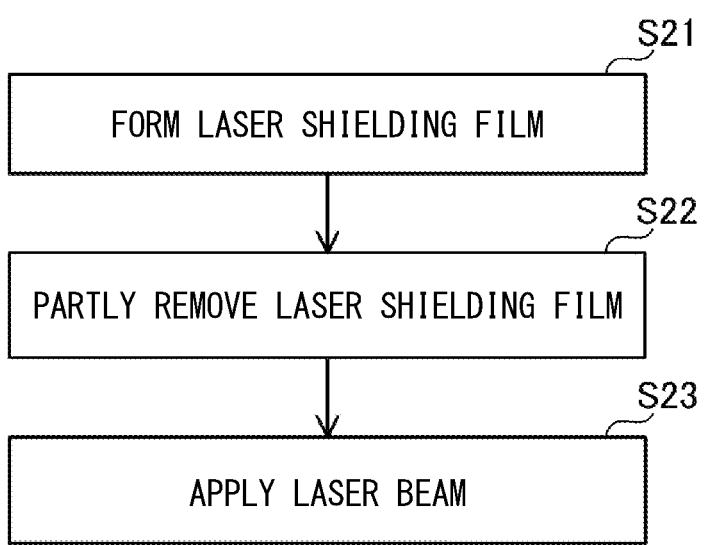
FIG. 11 is a diagram showing a flow of a second example of the laser application process.
Figure 12:
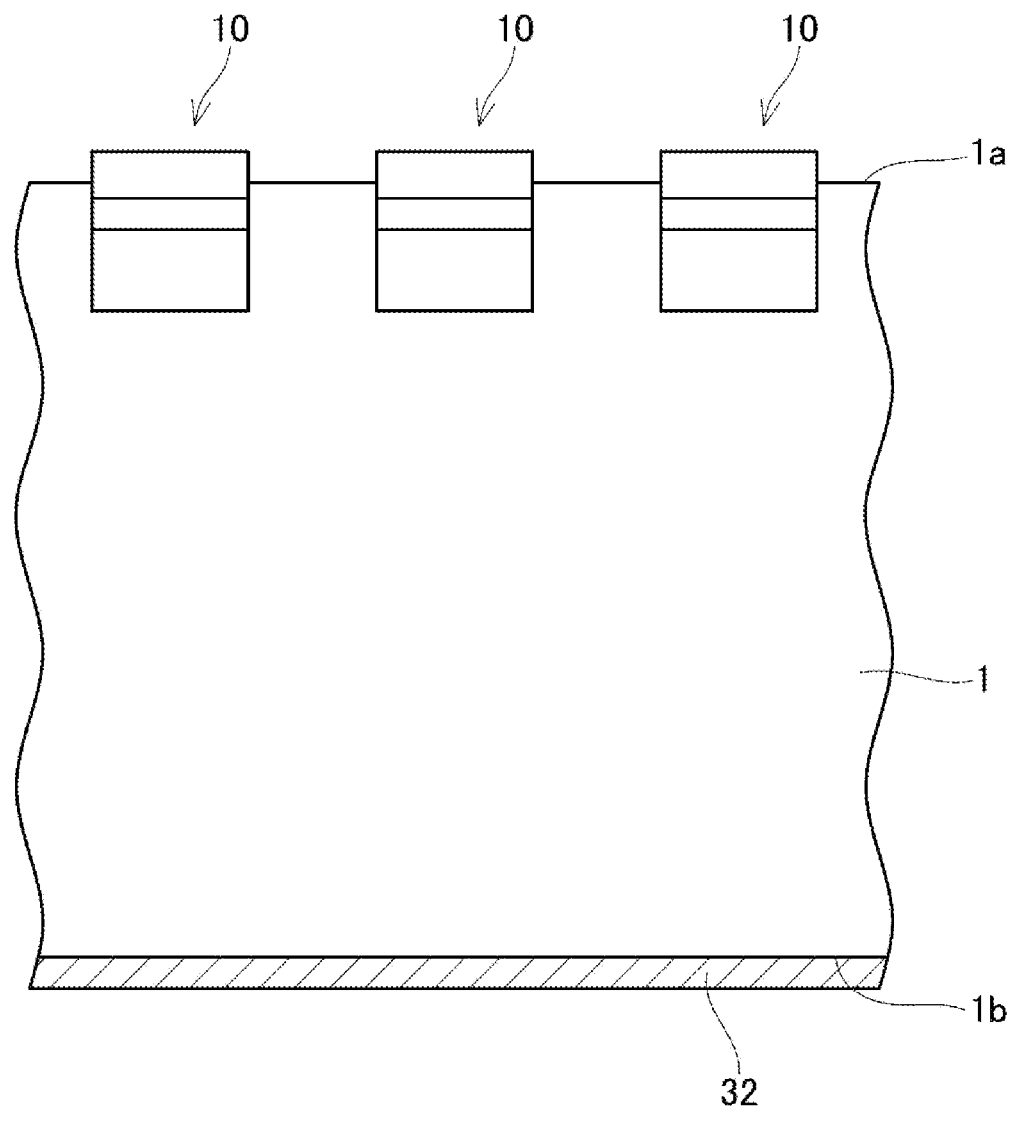
FIG. 12 is a diagram schematically showing a cross-sectional view of a semiconductor substrate in a step of the second example of the laser application process shown in FIG. 11.
Figure 13:
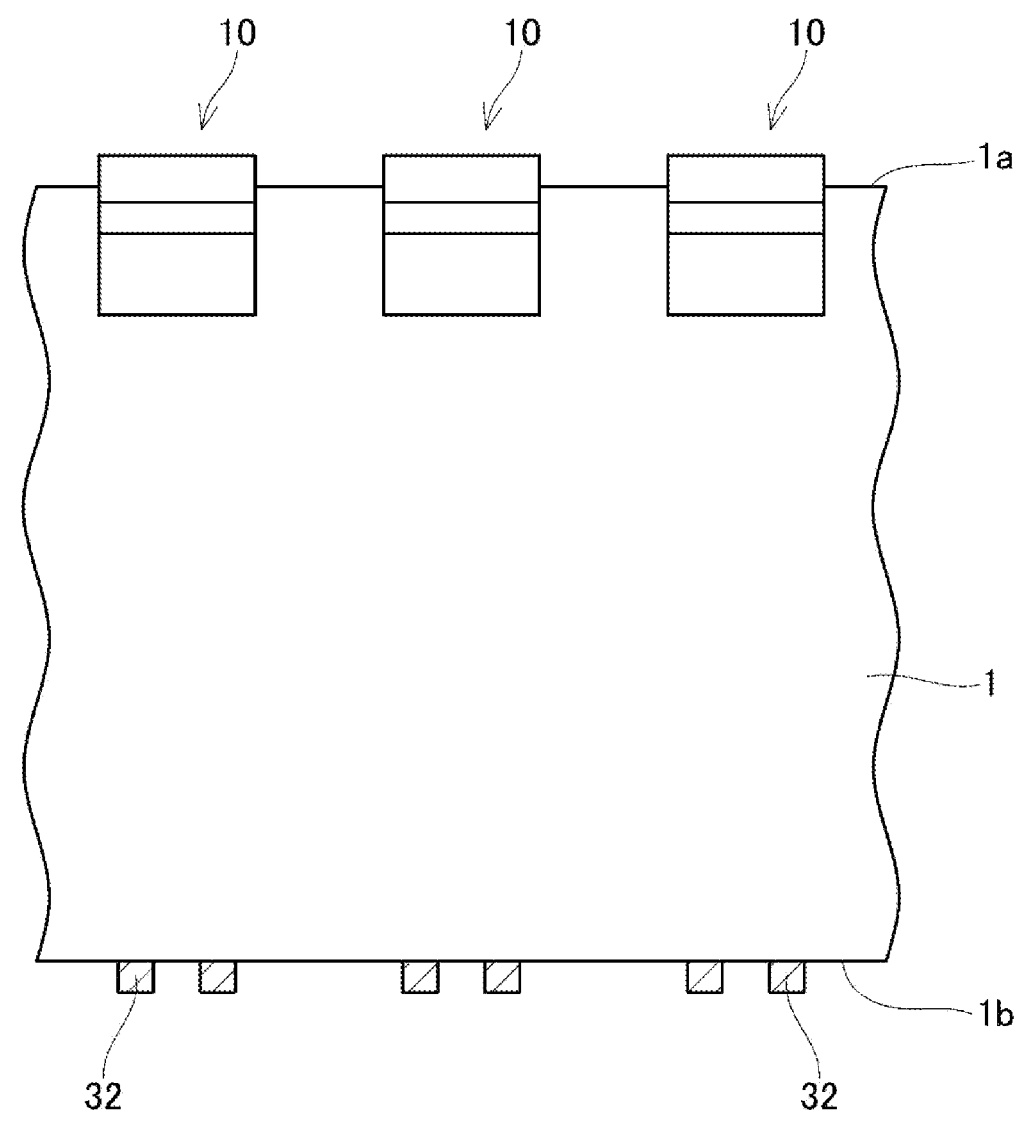
FIG. 13 is a diagram schematically showing a cross-sectional view of the semiconductor substrate in a step of the second example of the laser application process shown in FIG. 11.

Next, as shown in FIG. 13, the laser shielding film 32 is partly removed by using an etching technique so that regions of the laser shielding film 32 corresponding to the lower side of the channels CL of the semiconductor devices 10 remain (S22 in FIG. 11). Specifically, the laser shielding film 32 is left in at least a part of the region corresponding to the channel CH of the device structure 10, when the semiconductor substrate 1 is viewed in the direction orthogonal to the surface of the semiconductor substrate 1, that is, in the thickness direction of the semiconductor substrate 1. For example, the laser shielding film 32 is left in the entire region overlapping with the channel CH of the device structure 10 in the thickness direction of the semiconductor substrate 1.

Figure 14:
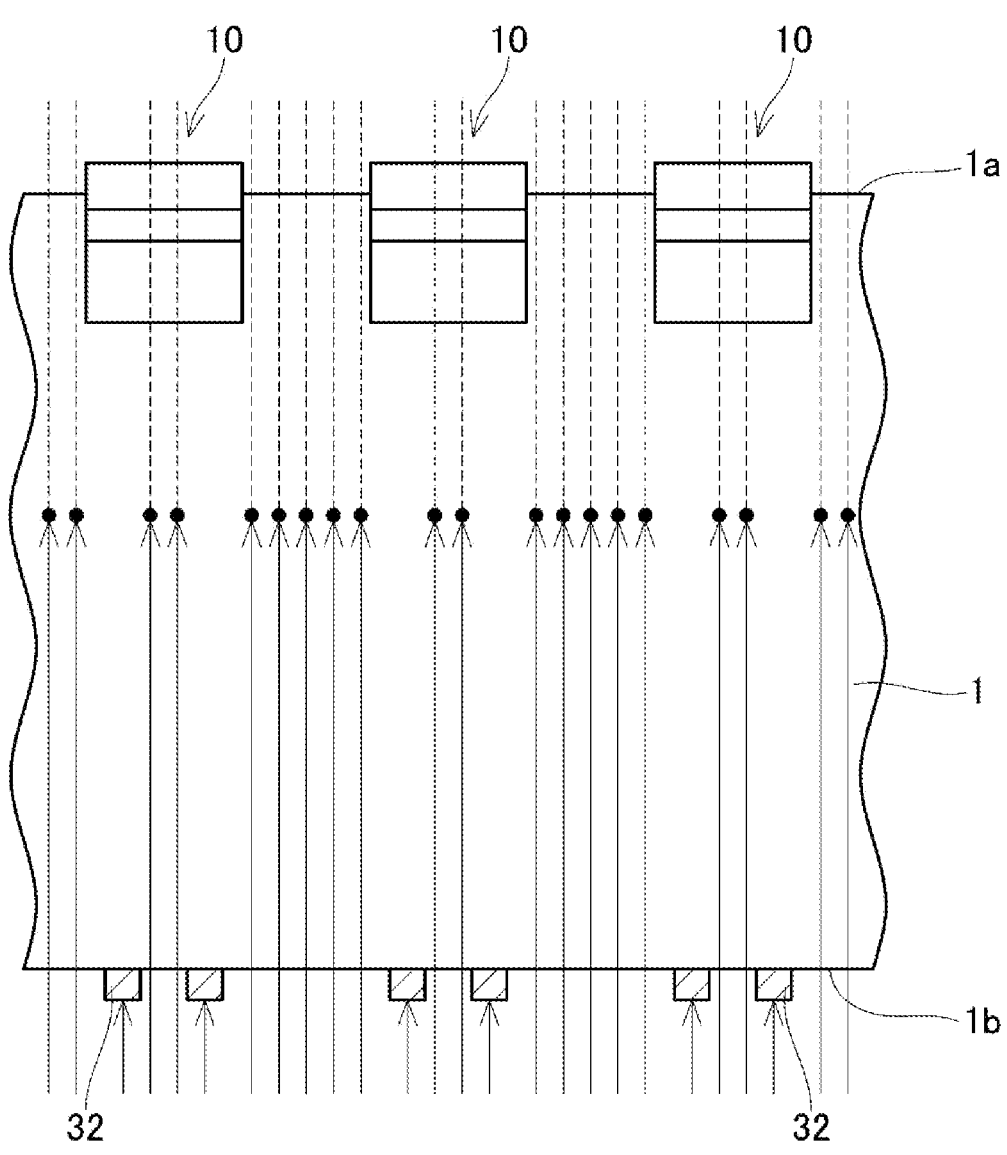
FIG. 14 is a diagram schematically showing a cross-sectional view of the semiconductor substrate in a step of the second example of the laser application process shown in FIG. 11.

Next, as shown in FIG. 14, the laser beam L is applied to the predetermined depth in the semiconductor substrate 1 from the lower surface 1*b* side of the semiconductor substrate 1 (S23 in FIG. 11). The laser beam L is applied to the predetermined depth of the semiconductor substrate 1 through the laser shielding film 32. Since the laser shielding film 32 shields the laser beam L, the power density of the laser beam L is lowered in the region corresponding to the lower side of the channel CH of the device structure 10 than in the other region, in the plane 3 extending at the predetermined depth in the semiconductor substrate 1. As a result, it is possible to suppress a part of the laser beams L that has not been absorbed at the focal point at the predetermined depth of the semiconductor substrate 1 from reaching the channel CH of the device structure 10, as shown by dashed lines in FIG. 14.

<Third Example of Laser Application Process)

A third example of the laser application process will be described with reference to FIGS. 15 to 20. The third example of the laser application process is characterized by forming a laser shielding film inside the semiconductor substrate 1 prior to the forming of the device structures 10. As shown in FIG. 16, in the third example of the laser application process, a laser shielding film 42 is firstly formed on an entire surface of a base substrate 100 (S31 in FIG. 15). The material of the laser shielding film 42 may be the same as that of the laser shielding film 32 used in the second example of the laser application process.

Figure 17:
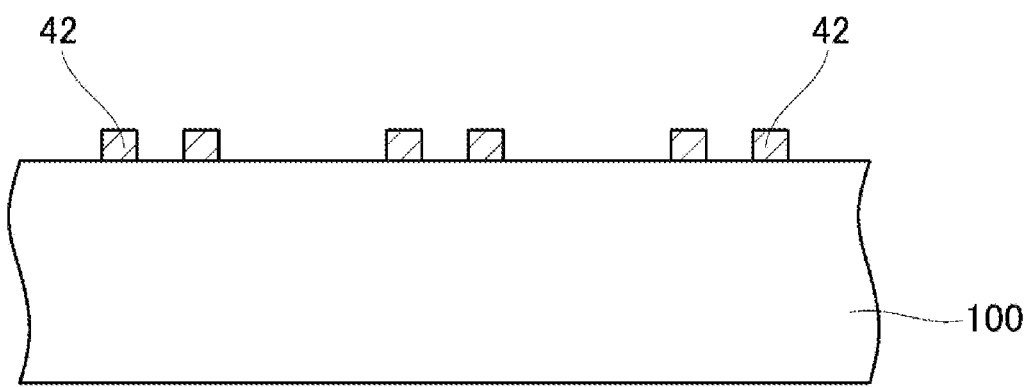
FIG. 17 is a diagram schematically showing a cross-sectional view of the semiconductor substrate in a step of the third example of the laser application process shown in FIG. 15.

Next, as shown in FIG. 17, the laser shielding film 42 is partly removed by using an etching technique, so that the laser shielding film 42 is left in a region corresponding to a formation position in which the channel CH of the device structure 10 is to be formed later (S32 in FIG. 15).

Figure 15:
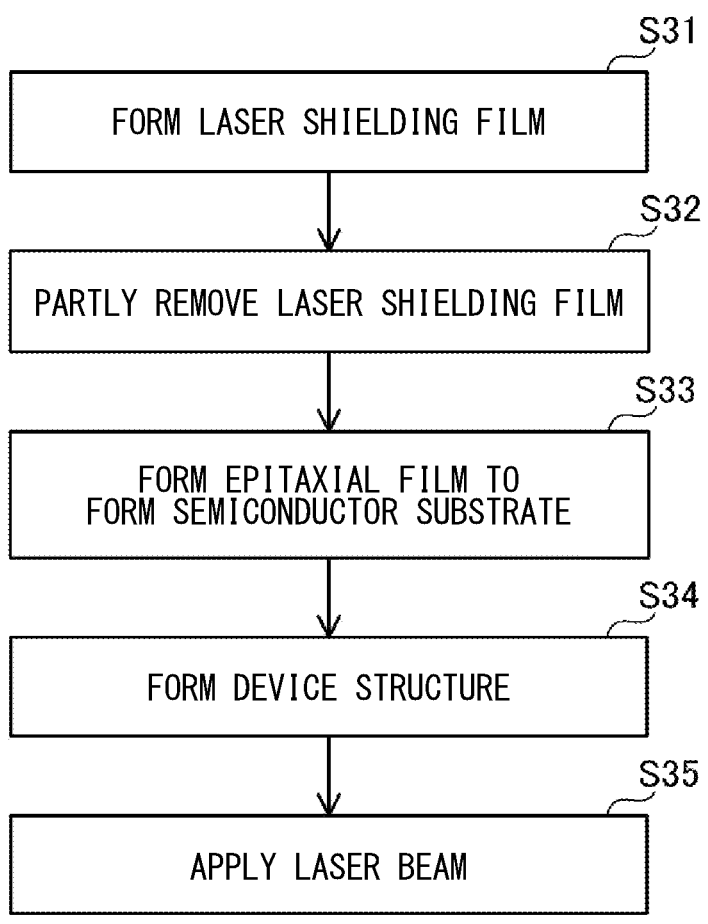
FIG. 15 is a diagram showing a flow of a third example of the laser application process.
Figure 16:
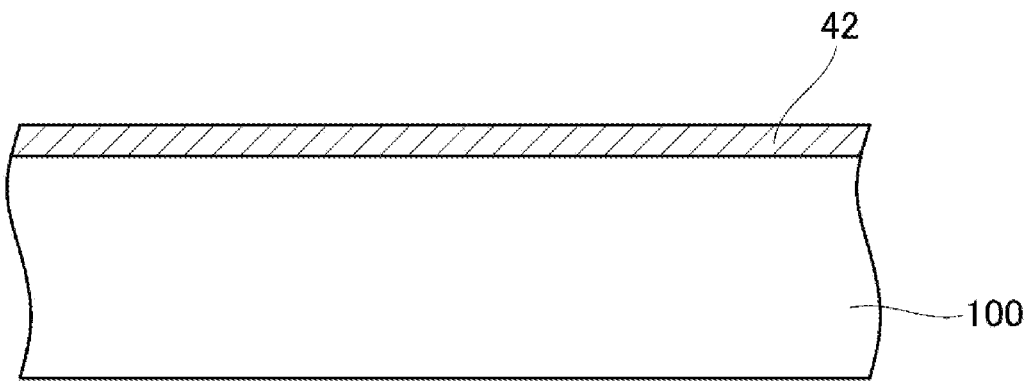
FIG. 16 is a diagram schematically showing a cross-sectional view of a semiconductor substrate in a step of the third example of the laser application process shown in FIG. 15.
Figure 18:
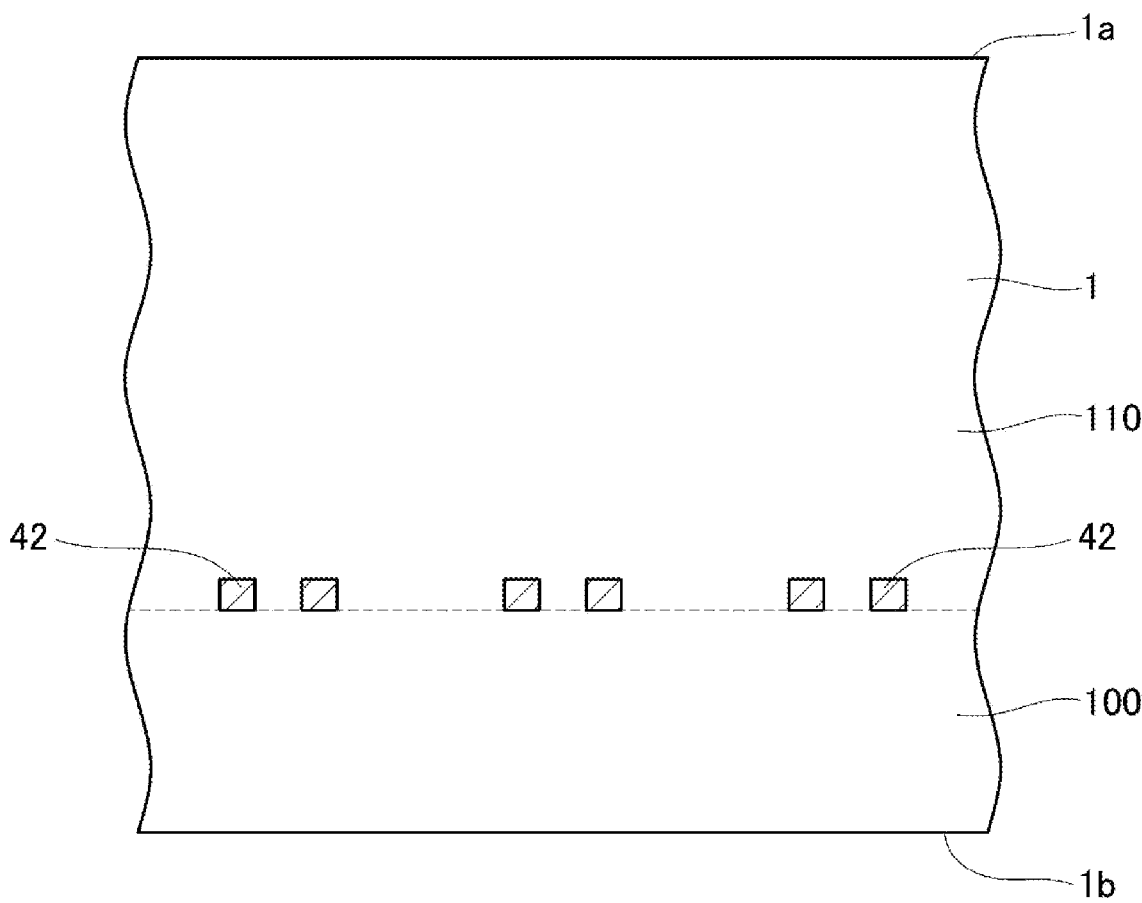
FIG. 18 is a diagram schematically showing a cross-sectional view of the semiconductor substrate in a step of the third example of the laser application process shown in FIG. 15.

Next, as shown in FIG. 18, an epitaxial layer 110 is film-formed on the surface of the base substrate 100 by using an epitaxial technique, thereby to form the semiconductor substrate 1 (S33 in FIG. 15). In this way, the laser shielding film 42 is formed as being embedded inside the semiconductor substrate 1.

Figure 19:
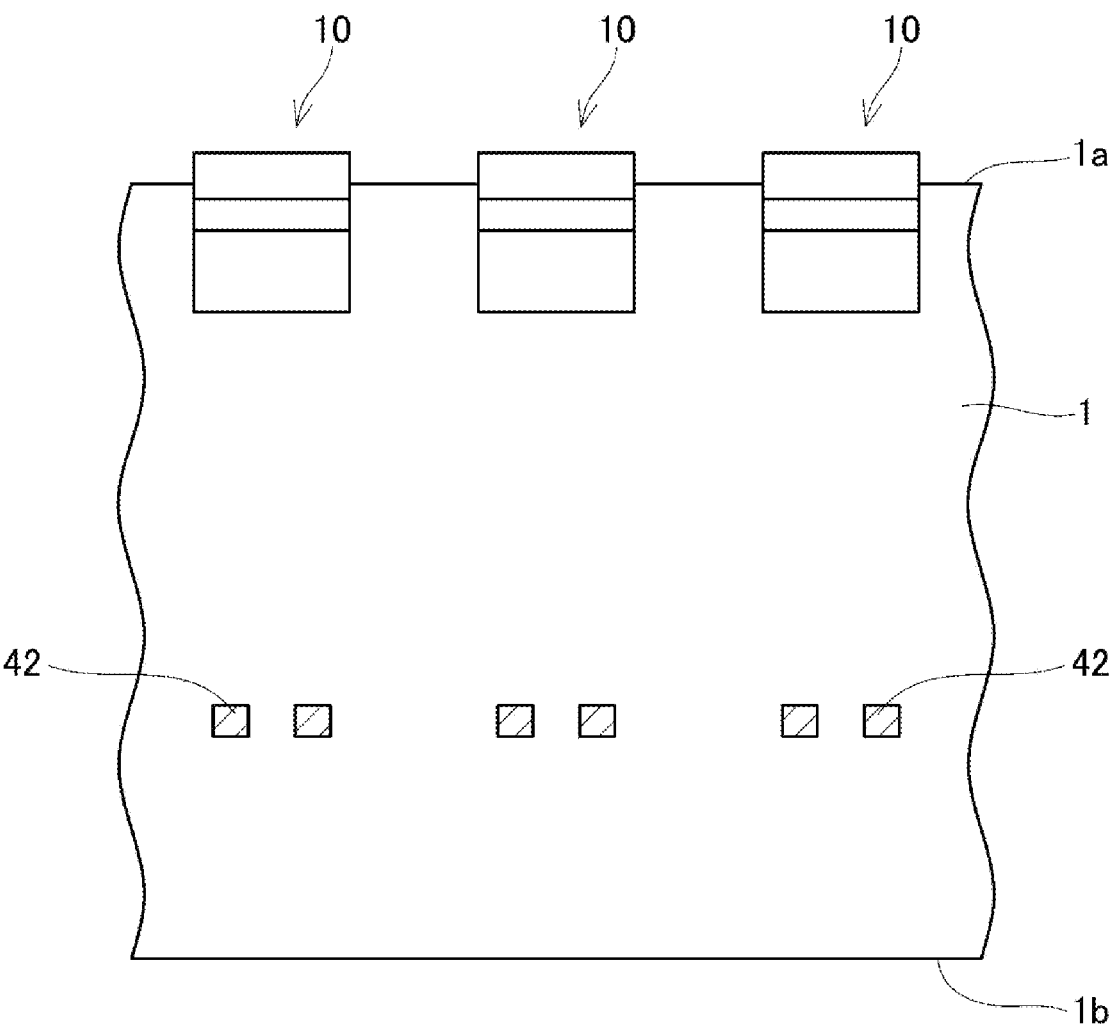
FIG. 19 is a diagram schematically showing a cross-sectional view of the semiconductor substrate in a step of the third example of the laser application process shown in FIG. 15.

Next, as shown in FIG. 19, the device structures 10 are formed adjacent to the upper surface 1*a* of the semiconductor substrate 1 (S34 in FIG. 15). The laser shielding film 42, embedded inside the semiconductor substrate 1, is arranged to overlap at least a part of the region corresponding to the channel CH of the device structure 10 when the semiconductor substrate 1 is viewed in the direction orthogonal to the surface of the semiconductor substrate 1. For example, the laser shielding film 42 is arranged to overlap the entirety of the region corresponding to the channel CH of the device structure 10.

Figure 20:
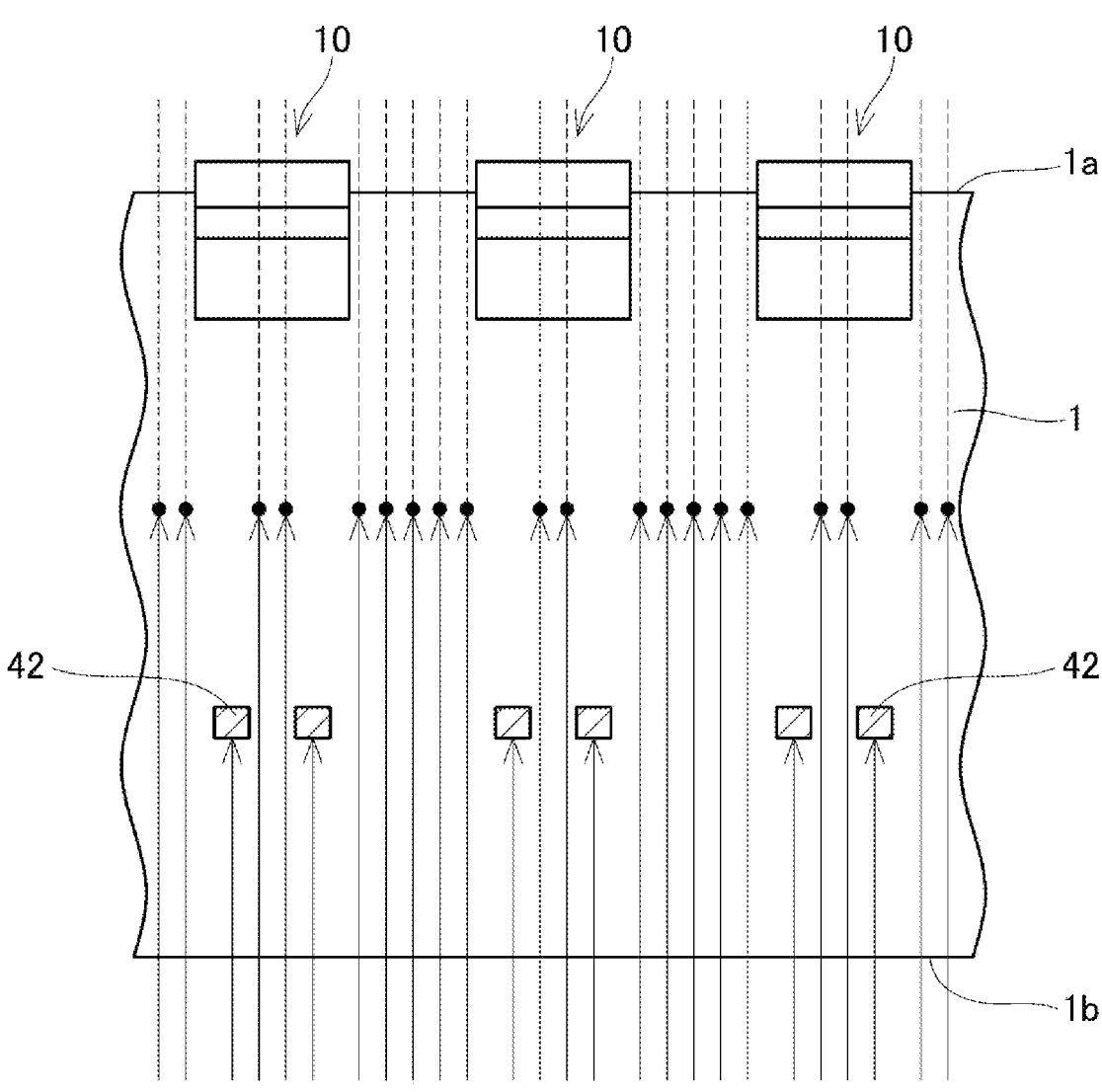
FIG. 20 is a diagram schematically showing a cross-sectional view of the semiconductor substrate in a step of the third example of the laser application process shown in FIG. 15.

Next, as shown in FIG. 20, the laser beam L is applied to the predetermined depth of the semiconductor substrate 1 from the lower surface 1*b* side (S35 in FIG. 15). The laser beam L is applied to the predetermined depth of the semiconductor substrate 1 through the laser shielding film 42. Since the laser shielding film 42 shields the laser beam L, the power density of the laser beam L is lowered in the region corresponding to the lower side of the channel CH of the device structure 10 than in the other region, in the plane 3 extending at the predetermined depth in the semiconductor substrate 1. As a result, it is possible to suppress a part of the laser beams L that has not been absorbed at the focal point at the predetermined depth of the semiconductor substrate 1 from reaching the channel CH of the device structure 10, as shown by dashed lines in FIG. 20.

<Fourth Example of Laser Application Process>

A fourth example of the laser application process will be described with reference to FIGS. 21 to 26. As shown in FIG. 22, in the fourth example of the laser application process, a mask 52 is firstly formed on the entire lower surface 1b of the semiconductor substrate 1 (S41 in FIG. 21). The mask 52 is not particularly limited, but may be photoresist, for example.

Figure 21:
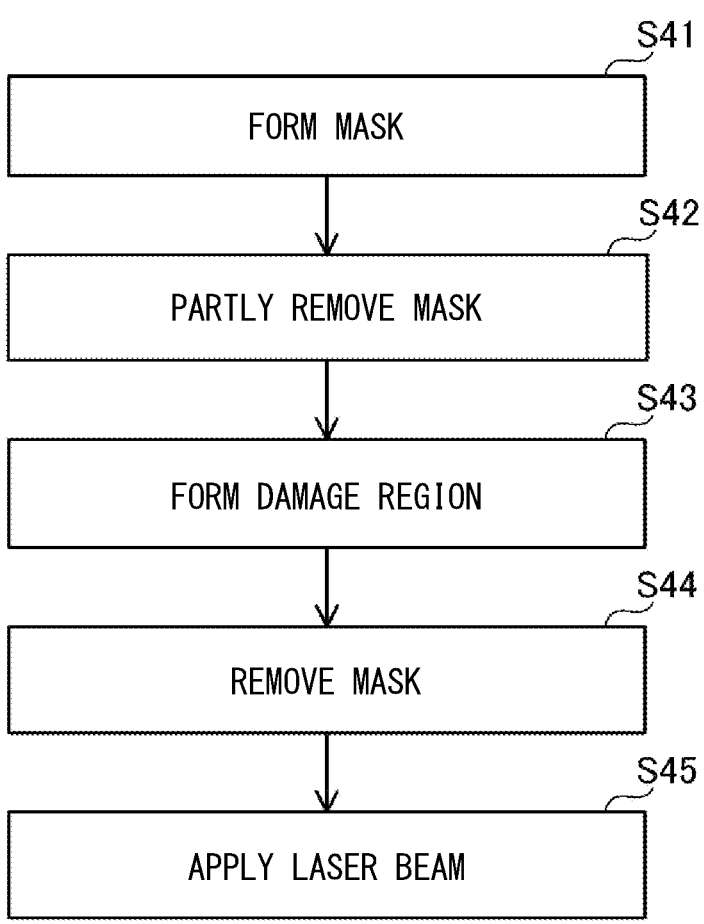
FIG. 21 is a diagram showing a flow of a fourth example of the laser application process.
Figure 22:
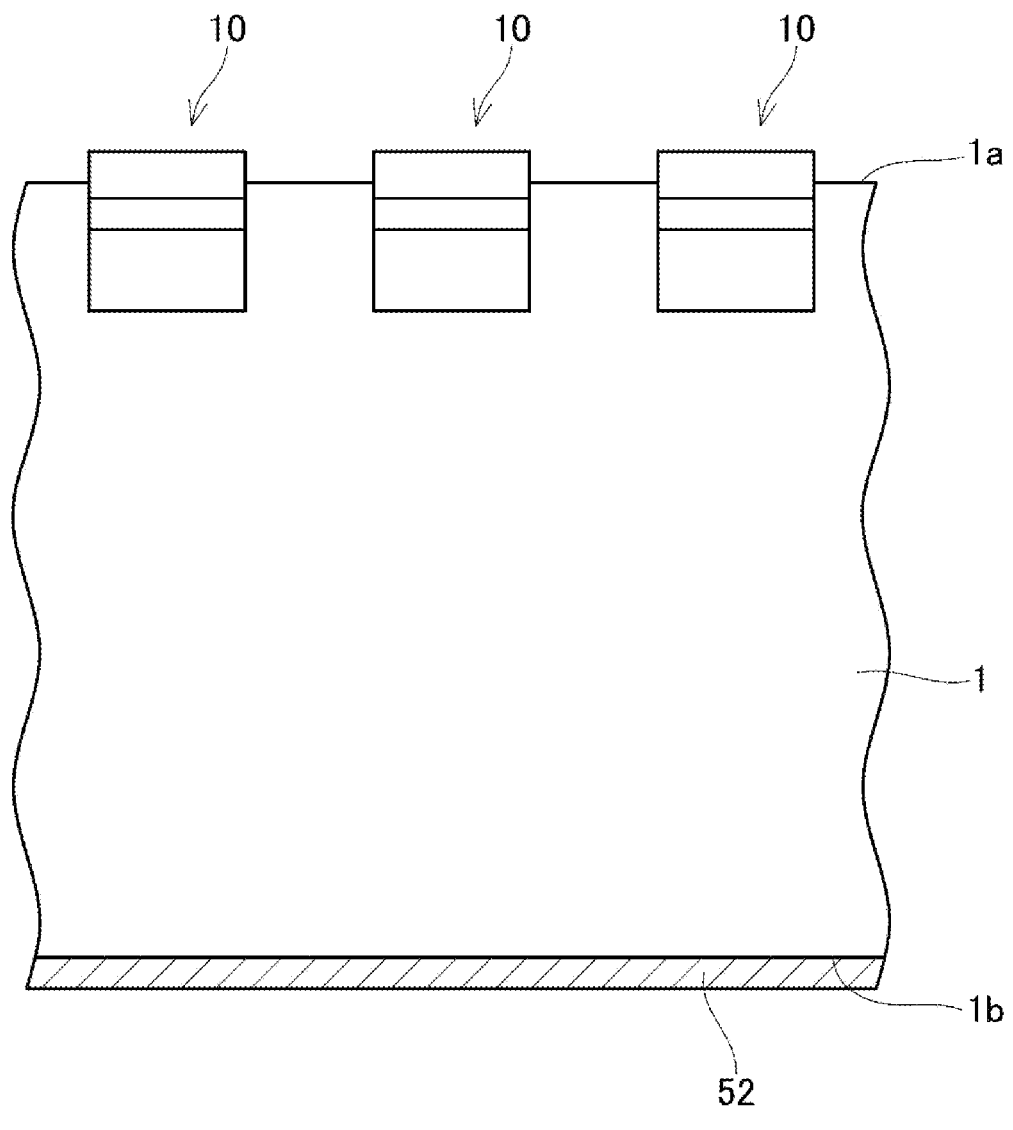
FIG. 22 is a diagram schematically showing a cross-sectional view of a semiconductor substrate in a step of the fourth example of the laser application process shown in FIG. 21.
Figure 23:
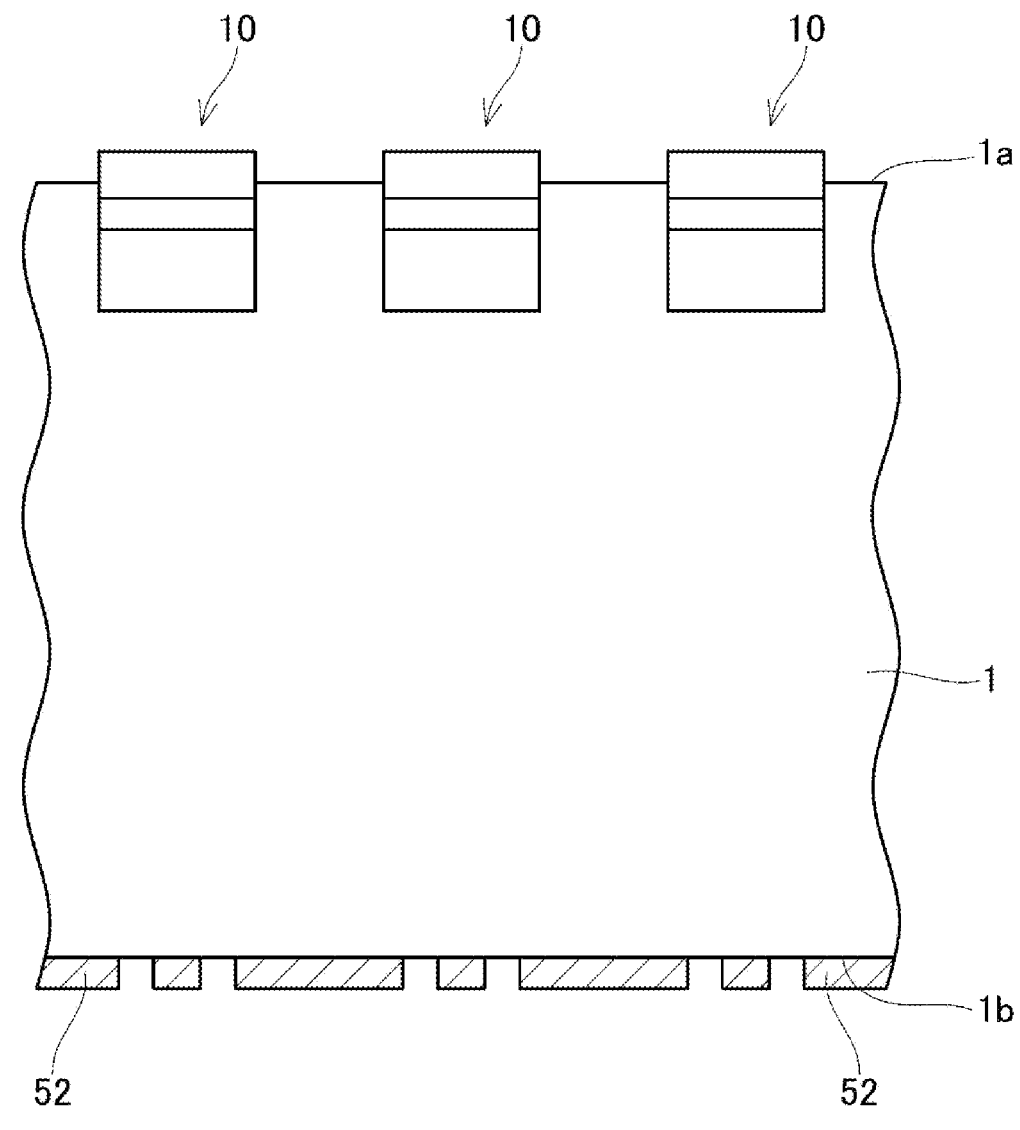
FIG. 23 is a diagram schematically showing a cross-sectional view of the semiconductor substrate in a step of the fourth example of the laser application process shown in FIG. 21.

Next, as shown in FIG. 23, the mask 52 is partly removed by using an etching technique, so that a region of the mask 52 corresponding to the lower side of the channel CH of the device structure 10 is opened (S42 in FIG. 21). Specifically, the mask 52 is left so that at least a part of the region overlapping the channel CH of the device structure 10 is opened, when the semiconductor substrate 1 is viewed in the direction orthogonal to the surface of the semiconductor substrate 1. For example, the mask 52 is formed so that the entirety of the region overlapping the channel CH of the device structure 10 is opened.

Figure 24:
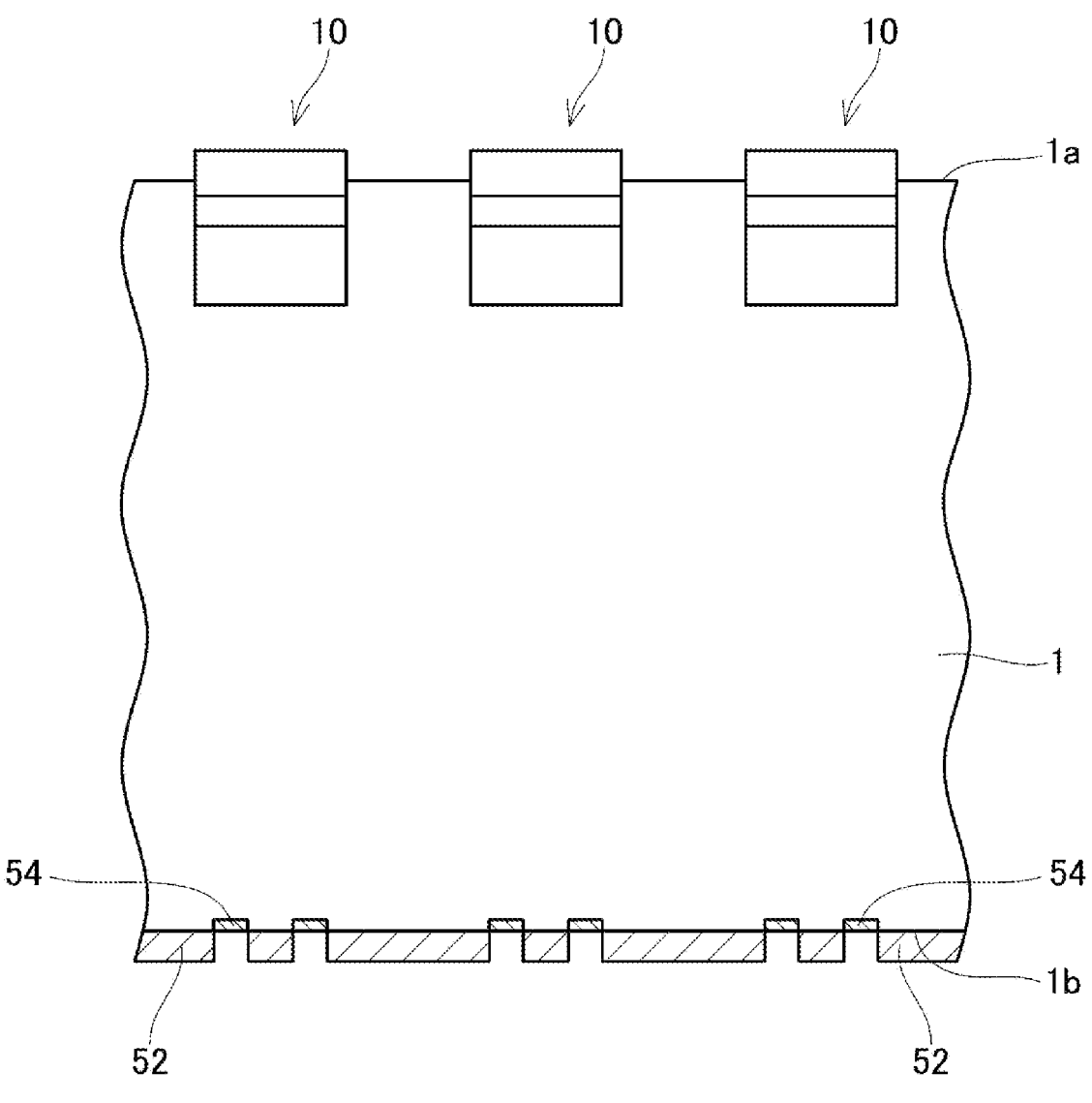
FIG. 24 is a diagram schematically showing a cross-sectional view of the semiconductor substrate in a step of the fourth example of the laser application process shown in FIG. 21.

Next, as shown in FIG. 24, the lower surface 1 b of the semiconductor substrate 1 exposed from the mask 52 is damaged to form a damage region 54 (S43 in FIG. 21). The treatment for forming the damage region 54 is not particularly limited, but may be a wet etching treatment, a dry etching treatment with plasma application, or ion-implantation treatment of inert ion such as nitrogen ion or argon ion. The damage region 54 is a region in which a surface roughness is increased after such a treatment.

Figure 25:
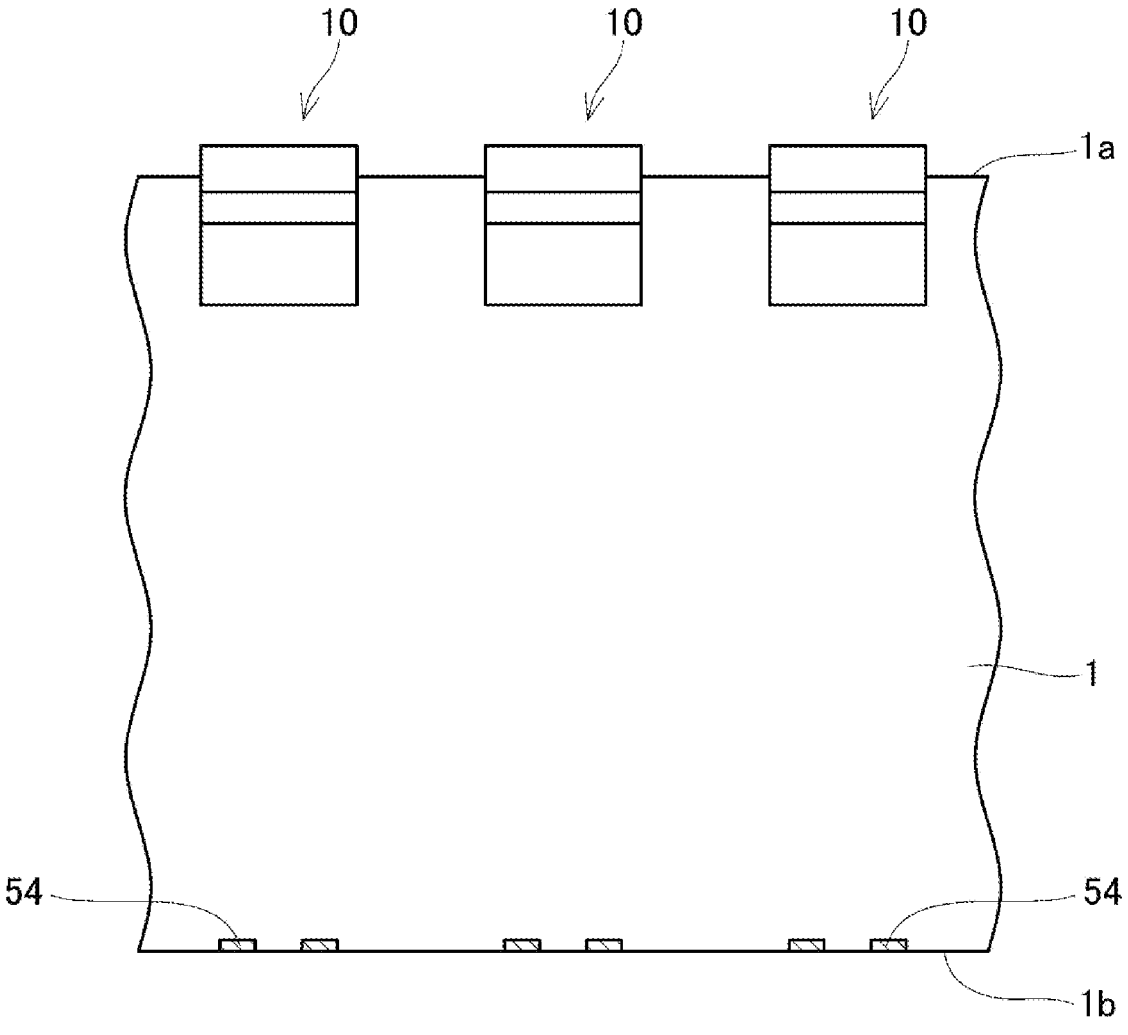
FIG. 25 is a diagram schematically showing a cross-sectional view of the semiconductor substrate in a step of the fourth example of the laser application process shown in FIG. 21.

Next, as shown in FIG. 25, the mask 52 is removed by using an etching technique (S44 in FIG. 21).

Figure 26:
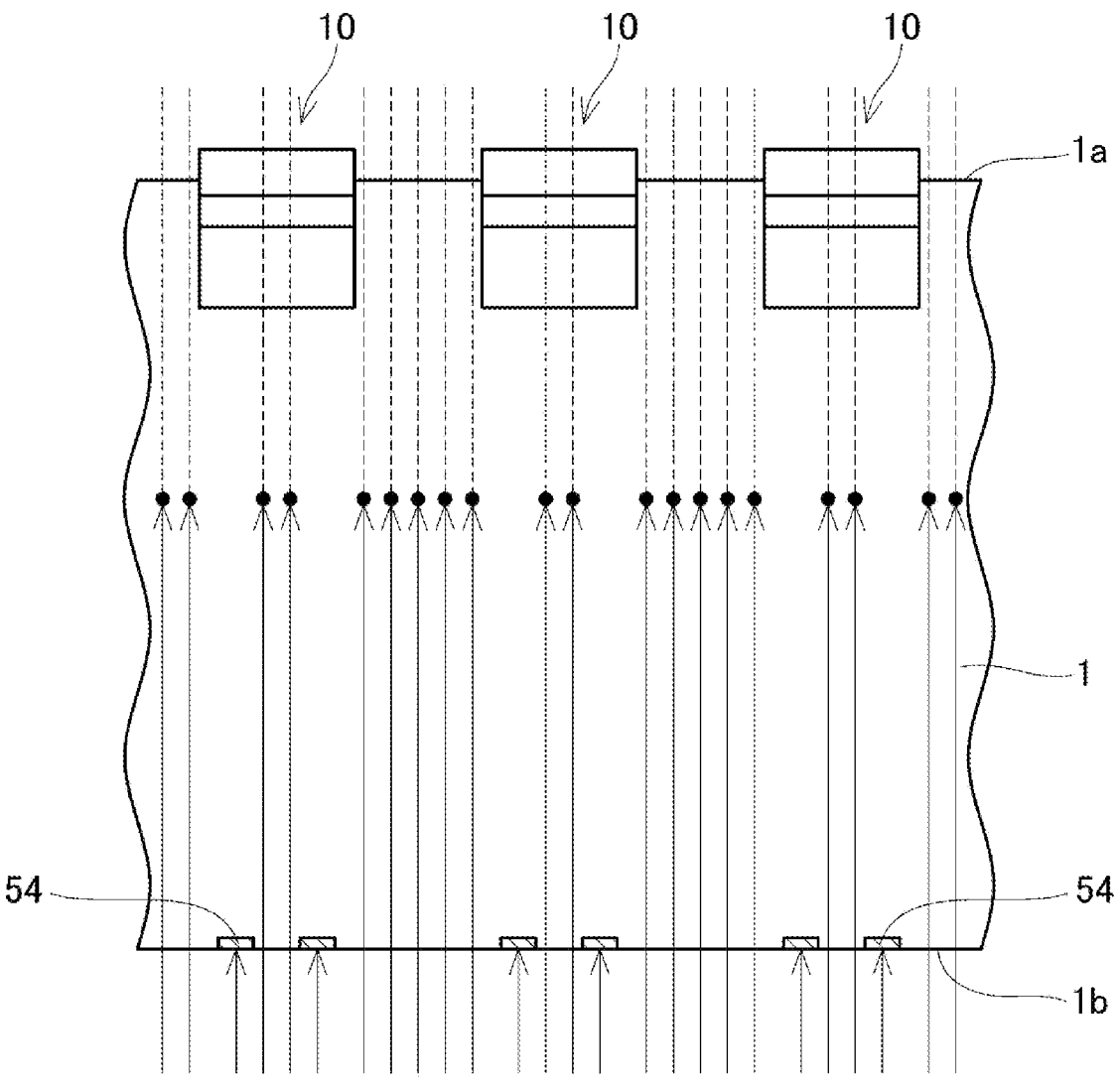
FIG. 26 is a diagram schematically showing a cross-sectional view of the semiconductor substrate in a step of the fourth example of the laser application process shown in FIG. 21.

Next, as shown in FIG. 26, the laser beam L is applied to the predetermined depth of the semiconductor substrate 1 from the lower surface 1b side of the semiconductor substrate 1 (S45 in FIG. 21). The laser beam L is applied to the predetermined depth of the semiconductor substrate 1 through the damaged region 54. Since the damage region 54 blocks the laser beam L by reflection and/or scattering, the laser beam L is applied so that the power density is lower in the region corresponding to the lower side of the channel CH of the device structure 10 than in the other region, in the plane 3 extending at the predetermined depth in the semiconductor substrate 1. As a result, it is possible to suppress a part of the laser beams L that has not been absorbed at the focal point at the predetermined depth of the semiconductor substrate 1 from reaching the channel CH of the device structure 10, as shown by dashed lines in FIG. 26.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A method for manufacturing a semiconductor device, comprising:
applying a laser beam to a plane extending at a predetermined depth in a semiconductor substrate from a second main surface side of the semiconductor substrate, the second main surface side being opposite to a first main surface side of the semiconductor substrate on which a device structure including a channel is formed, wherein the laser beam has a wavelength range that is transparent to the semiconductor substrate; and
peeling off a device layer including the device structure from the semiconductor substrate along the plane applied with the laser beam, wherein
the applying of the laser beam comprises applying the laser beam so that a power density is lower in a first region in a plan view corresponding to the channel in a thickness direction of the semiconductor substrate than in a second region in the plan view which excludes the first region, in the plane extending at the predetermined depth in the semiconductor substrate, wherein in the applying the laser beam is focused at the predetermined depth inside the semiconductor substrate so as to heat and decompose a crystal forming the semiconductor substrate to form an altered layer inside the semiconductor substrate, and
the first region and the second region are predetermined based on channel coordinate data that specifies positions of the channel in a two-dimensional coordinate system.

2. The method according to claim 1, wherein the applying of the laser beam includes:
arranging a laser shielding film for shielding the laser beam to a region corresponding to the channel of the device structure in the thickness direction of the semiconductor substrate; and
applying the laser beam to the predetermined depth of the semiconductor substrate over the laser shielding film.

3. The method according to claim 2, wherein the arranging of the laser shielding film includes:
forming the laser shielding film on an entirety of the second main surface side of the semiconductor substrate; and
partly removing the laser shielding film so that the laser shielding film is left in the region corresponding to the channel of the device structure in the thickness direction of the semiconductor substrate.

4. The method according to claim 2, wherein the arranging of the laser shielding film includes:
forming the laser shielding film on an entirety of a surface of a base substrate;
partly removing the laser shielding film so that the laser shielding film is left in a region corresponding to a formation position where the channel of the device structure is to be formed; and
forming an epitaxial layer on the surface of the base substrate, thereby to form the semiconductor substrate.

5. The method according to claim 1, wherein the applying of the laser beam includes:
forming a mask on an entirety of the second main surface side of the semiconductor substrate;
removing a part of the mask so that a region corresponding to the channel of the device structure in the thickness direction of the semiconductor substrate is opened;
forming a damage region by applying damage to a portion of the semiconductor substrate exposed from the mask;
removing the mask, after the forming of the damage region; and
applying the laser beam to the predetermined depth of the semiconductor substrate over the damage region.

6. The method according to claim 1, wherein the semiconductor substrate is made of a compound semiconductor.

7. The method according to claim 1, wherein in the applying of the laser beam, the laser beam is applied so that, at a position of a focal point of the laser beam in the second region, the crystal forming the semiconductor substrate is heated and decomposed to form an extraction layer of atoms forming the crystal, as the altered layer.

8. The method according to claim 7, wherein the semiconductor substrate is made of a nitride semiconductor including gallium nitride, and the extraction layer is made of gallium.

9. A method for manufacturing a semiconductor device, comprising:

applying a laser beam to a plane extending at a predetermined depth in a semiconductor substrate from a second main surface side of the semiconductor substrate, the second main surface side being opposite to a first main surface side of the semiconductor substrate on which a device structure including a channel is formed; and peeling off a device layer including the device structure from the semiconductor substrate along the plane applied with the laser beam, wherein in the applying of the laser beam, the laser beam is applied so that a power density is lower in a first region in a plan view corresponding to the channel in a thickness direction of the semiconductor substrate than in a second region in the plan view which excludes the first region, in the plane extending at the predetermined depth in the semiconductor substrate, wherein the applying of the laser beam includes:

preparing a laser application coordinate data including a plurality of application position coordinates for specifying positions in the semiconductor substrate to apply the laser beam, in a two-dimensional coordinate system that defines in-plane positions of the semiconductor substrate;

preparing a channel coordinate data including one or more channel position coordinates for specifying the position of the channel in the two-dimensional coordinate system;

categorizing the plurality of application position coordinates of the laser application coordinate data into one or more first application position coordinates that are not included in the one or more channel position coordinates, and one or more second application position coordinates included in the one or more channel position coordinates; and applying the laser beam to the predetermined depth in the semiconductor substrate at one or more positions corresponding to the one or more first application position coordinates without applying at one or more positions corresponding to the one or more second application position coordinates.

10. The method according to claim 9, wherein the semiconductor substrate is made of a compound semiconductor.

11. A method for manufacturing a semiconductor device, comprising:

applying a laser beam to a plane extending at a predetermined depth in a semiconductor substrate from a second main surface side of the semiconductor substrate, the second main surface side being opposite to a first main surface side of the semiconductor substrate on which a device structure including a channel is formed; and peeling off a device layer including the device structure from the semiconductor substrate along the plane applied with the laser beam, wherein in the applying of the laser beam, the laser beam is applied so that a power density is lower in a first region in a plan view corresponding to the channel in a thickness direction of the semiconductor substrate than in a second region in the plan view which excludes the first region, in the plane extending at the predetermined depth in the semiconductor substrate, wherein the applying of the laser beam includes:

preparing a laser application coordinate data including a plurality of application position coordinates for specifying positions in the semiconductor substrate to apply the laser beam, in a two-dimensional coordinate system that defines in-plane positions of the semiconductor substrate;

preparing a channel coordinate data including one or more channel position coordinates for specifying the position of the channel in the two-dimensional coordinate system;

categorizing the plurality of application position coordinates of the laser application coordinate data into one or more first application position coordinates that are not included in the one or more channel position coordinates, and one or more second application position coordinates included in the one or more channel position coordinates; and applying the laser beam to the predetermined depth in the semiconductor substrate at one or more positions corresponding to the one or more first application position coordinates, while applying at one or more positions corresponding to the one or more second application position coordinates with a smaller application energy than that at the one or more positions corresponding to the one or more first application position coordinates.

12. The method according to claim 11, wherein the semiconductor substrate is made of a compound semiconductor.

* * * * *